United States Patent [19]

Izawa et al.

[11] 3,997,377

[45] Dec. 14, 1976

[54] METHOD OF MAKING A LIQUID PHASE EPITAXIAL-LAYERS OF GALLIUM PHOSPHIDE ON MULTIPLE WAFERS

[75] Inventors: Nobuyuki Izawa, Sagamihara; Kazuya Tanabe, Zama, both of Japan

[73] Assignee: Sony Corporation, Tokyo, Japan

[22] Filed: Feb. 4, 1975

[21] Appl. No.: 547,050

[30] Foreign Application Priority Data

Feb. 7, 1974    Japan .............................. 49-15724

[52] U.S. Cl. ..................... 148/172; 148/171; 148/1.5; 252/62.3 GA; 118/415
[51] Int. Cl.² ............... H01L 21/208; H01L 21/225
[58] Field of Search ............ 148/171, 172, 173, 1.5; 252/62.3 GA; 118/415

[56] References Cited

UNITED STATES PATENTS

| 3,759,759 | 9/1973  | Solomon ........................ 148/171 |
| 3,854,447 | 12/1974 | Kobayashi ................... 148/171 X |
| 3,859,148 | 1/1975  | Dawson et al. ................ 148/172 |
| 3,870,575 | 3/1975  | Dosen ........................... 148/171 |
| 3,893,875 | 7/1975  | Watanabe et al. .............. 148/172 |

Primary Examiner—G. Ozaki
Attorney, Agent, or Firm—Hill, Gross, Simpson, Van Santen, Steadman, Chiara & Simpson

[57] ABSTRACT

A method of making a liquid phase epitaxial layer of gallium phosphide on each of two semiconductor wafers which are disposed above and below each other in parallel, and at a predetermined distance.

12 Claims, 9 Drawing Figures

METHOD OF MAKING A LIQUID PHASE EPITAXIAL-LAYERS OF GALLIUM PHOSPHIDE ON MULTIPLE WAFERS

BACKGROUND OF THE INVENTION

1. Field of the Invention

This invention relates to a method of making a liquid phase epitaxial layer of gallium phosphide, and more particularly to the method by which epitaxial layers with different thicknesses can be concurrently formed on respective semiconductor wafers in one operation.

2. Description of the Prior Art

Recently, a liquid phase epitaxial method has been widely used for the formation of an epitaxial layer of gallium phosphide. For example, the liquid phase epitaxial method of Nelson is known among the conventional liquid phase epitaxial methods.

It is generally required in the formation of light-emitting diodes to vary the thickness of the epitaxial layer with the use of the light-emitting diodes. However, it is impossible to form concurrently epitaxial layers with different thicknesses on respective semiconductor wafers in one operation with the conventional liquid phase epitaxial method.

SUMMARY OF THE INVENTION

A so-called gallium-gallium phosphide (Ga-GaP) solution is used for a liquid phase epitaxial growth method according to this invention. The gallium-gallium phosphide solution is formed by the melting of gallium phosphide into gallium as a solvent.

The concentration of gallium phosphide is the largest on the surface of the gallium-gallium phosphide solution, and it decreases with the distance downward from the surface, since the specific gravity of gallium phosphide is considerably smaller than that of gallium.

Taking this fact into consideration, we propose a method by which liquid phase epitaxial layers with different thicknesses can be concurrently formed on respective semiconductor wafers in one operation.

Accordingly, it is an object of this invention is to provide a method by which epitaxial layers with different thicknesses can be concurrently formed on respective semiconductor wafers in one operation.

Another object of this invention is to provide light-emitting diodes having epitaxial layers with different thicknesses.

A further object of this invention is to provide a method by which gallium phosphide epitaxial layers with different thicknesses can be concurrently formed on respective gallium phosphide wafers.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
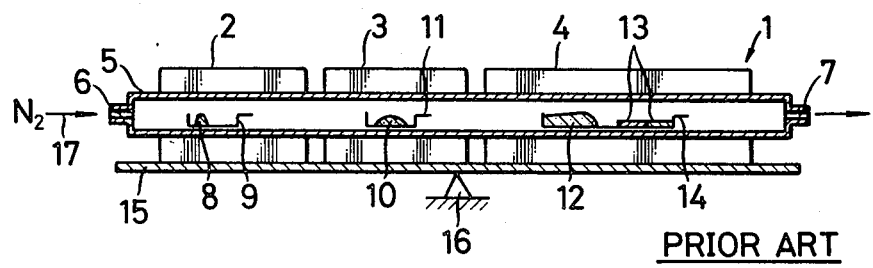
FIG. 1 is a schematic cross-sectional view of a conventional liquid phase epitaxial growth apparatus.
Figure 2:
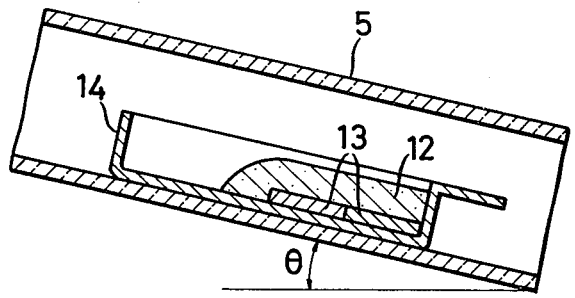
FIG. 2 is a cross-sectional view of a part of the apparatus of FIG. 1, tilted by a predetermined angle.

FIG. 1 and FIG. 2 show a conventional apparatus according to the liquid epitaxial method of Nelson by which epitaxial layers are concurrently formed on two wafers respectively.

A liquid phase epitaxial growth apparatus 1 comprises an open quartz tube 5. Three furnaces 2, 3 and 4 are arranged along the quartz tube 5. An inlet 6 is formed at the left end of the quartz tube 5. An inert gas $N_2$ is fed into the quartz tube 5 through the inlet 6. An outlet 7 is formed at the right end of the quartz tube 5. A reaction gas is discharged from the quartz tube 5 through the outlet 7. A boat 9 contains Zn 8 as a source of P-type impurities in the Zn-furnance 2. Another boat 11 contains a mixture 10 of $Ga-Ga_2O_3$ in the $O_2$ - furnace 3 A further boat 14 contains a melt 12 of Ga-GaP solution and two N-type semiconductor wafers 13 formed of compound semiconductor GaP doped with N-type impurities, for example Te, spaced from each other, in the liquid phase epitaxial growth furnace 4. The furnaces 2, 3 and 4 are adjusted to predetermined temperatures, respectively. They are fixed to a common base plate 15 which can be tilted clockwise or anti-clockwise around a fulcrum 16 arranged at the central portion of the common base plate 15.

While an $N_2$-gas 17 as a carrier gas is fed into the quartz tube 5 through the inlet 6 when the apparatus 1 is horizontally set, the interior of the Zn-furnace 2 is heated up to 700° C to melt the Zn 8, the interior of the $O_2$ furnace 3 heated up to 1200° C and the interior of the liquid phase epitaxial growth furnace 4 heated up to 1100° C. Zn 8 is evaporated in the Zn-furnace 2. $Ga_2O$ formed by the chemical reaction of Ga and $Ga_2O_3$ is evaporated in the $O_2$ furnace 3. The vapors of Zn 8 and $Ga_2O$ are carried to the right in the quartz tube 5 by the $N_2$- gas 17, so that the vapors are diffused into the melt 12 of Ga-GaP solution contained by the boat 14 to form a source for liquid phase epitaxial growth.

Next, the liquid phase epitaxial growth apparatus 1 is tilted clockwise around the fulcrum 16 by a predetermined angle θ, for example, 5° to 6°, so that the melt 12 of Ga-GaP solution containing Zn and $Ga_2O$, namely, the source of the liquid phase epitaxial growth, flows to the right along the bottom of the boat 14. Accordingly, the melt 12 of Ga - GaP solution containing Zn and $Ga_2O$ covers the surfaces of the semiconductor wafers 13, as shown by FIG. 2. The epitaxial growth starts on the surfaces of the semiconductor wafers 13. After the surface layers of the semiconductor wafers 13 are saturated with Zn and O, the apparatus 1 is again horizontally set, and then the temperature of the interior of the furnace 4 is lowered to 900° C to form epitaxial layers of GaP containing Zn and O on the surfaces of the semiconductor wafers 13 respectively. The apparatus 1 is again horizontally set since there is a possibility that the surface of the one wafer (the left hand wafer in FIG. 1 or FIG. 2) cannot be sufficiently covered by the melt 12 when the melt 12 is small in quantity. However, if the melt 12 is sufficiently large in quantity, the interior of the furnace 4 may be cooled as that the apparatus remains tilted.

As a result, a P-type semiconductive region containing impurities Zn with a thickness of about $50\mu$ is formed on the surfaces of the N-type semiconductor wafers 13. A PN-junction is formed between the P-type semiconductive region and the N-type semiconductor wafer 13. Thus, a red light emitting diode is formed due to the existence of $Ga_2O$.

In the above-mentioned liquid phase epitaxial growth method, since the temperature at the liquid phase epitaxial growth and the composition of the melt 12 of Ga - GaP solution are specially chosen, the thicknesses of the P-type semiconductive regions epitaxially grown on the two N-type semiconductor wafers 13 are nearly equal to each other. Accordingly, it is impossible to concurrently form epitaxial layers remarkably different in thickness on plural semiconductor wafers in one operation, such as forming an epitaxial layer with a thickness of about $50\mu$ on one semiconductor wafer and concurrently forming an epitaxial layer with a thickness of about $100\mu$ on another semiconductor wafer. For such a growth process, the temperature on the liquid phase epitaxial growth and the composition of the melt 12 of Ga-Gap solution must be changed in order to form the epitaxial layer with a thickness of about $100\mu$. Otherwise, a different liquid phase epitaxial growth apparatus must be prepared in accordance with the thickness of the layer to be epitaxially grown. Thus, since epitaxial layers differing in thickness cannot be concurrently formed in one operation, the conventional method is very troublesome. When a thick epitaxial layer, for example, for a numeral display device is needed, a higher temperature is required during the epitaxial growth. Accordingly, the conventional method has the disadvantages that the impurities from the quartz tube are apt to mix into a growing layer and that the operating time becomes too long.

Next, embodiments of this invention will be described with reference to FIG. 3 to FIG. 8, which are applied to red light emitting diodes.

Figure 3A:
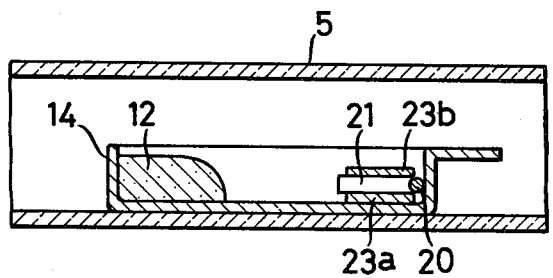
FIG. 3A is a cross-sectional view of the main portion of a liquid phase epitaxial growth apparatus according to one embodiment of this invention.
Figure 4:
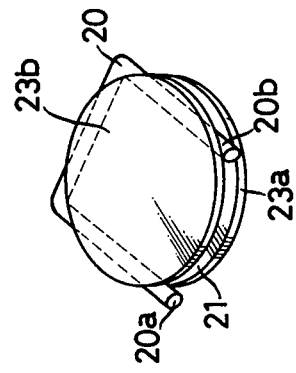
FIG. 4 is a perspective view showing the arrangement of two semiconductor wafers in FIG. 3A and FIG. 3B.

FIG. 3 and FIG. 4 show one embodiment of this invention. The conventional liquid phase epitaxial growth apparatus shown in FIG. 1 may be utilized for this embodiment. Parts in FIG. 3 and FIG. 4 which correspond to the parts in FIG. 1 are denoted by the same reference numerals, which will not be described.

As shown on FIG. 3A, two N-type semiconductor wafers 23a and 23b are aligned substantially parallel to each other with one above by use of a spacer 20 at the right side of the boat 14 arranged in the furnace 4. As shown on FIG. 4, the spacer 20 comprises a quartz U-shaped member 2mm thick. Both arm portions 20a and 20b of the U-shaped member are parallel to each other and interposed between the upper semiconductor wafer 23b and the lower semiconductor wafer 23a. Thus, the two semiconductor wafers 23a and 23b are spaced parallel and 2mm apart from each other by the spacer 20.

It is preferable that the distance between the wafers 23a and 23b be 1.5mm to 6mm. If the distance between the wafers 23a and 23b is under 1.5mm, the melt 12 cannot sufficiently fill a space 21 between the wafers 23a and 23b due to the great surface tension of the melt 12. If the distance between the wafers 23a and 23b is over 6mm, the required quantity of the melt 12 is considerably increased which adversely affects the manufacturing cost. The thickness of the epitaxial layer grown on the wafer 23a or 23b is nearly constant when the distance between the wafers 23a and 23b is within the range of 1.5 mm to 6mm.

Figure 3B:
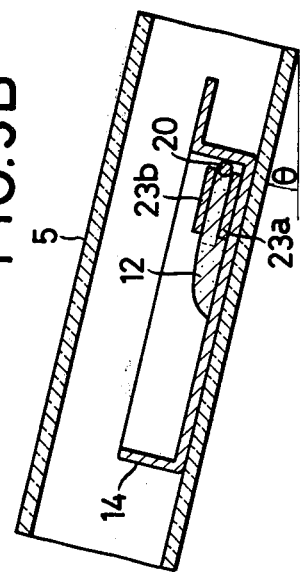
FIG. 3B is a cross-sectional view of the main part of FIG. 3A, tilted by a predetermined angle.

Next, operation of the liquid phase epitaxial growth apparatus of FIG. 3A, FIG. 3B and FIG. 4 will be described in detail.

The method for the formation of the source of the liquid phase epitaxial growth may be the same as the conventional method employing the apparatus of FIG. 1.

While the $N_2$ gas is fed through the quartz tube 5 when the apparatus is horizontally set, the interior of the Zn-furnace 2 is heated up to 700° C to evaporate Zn 8 and the interior of the $O_2$ furnace 3 is heated up to 1200° C to evaporate $Ga_2O$. The vapors of Zn and $Ga_2O$ are carried to the furnace 4 by the $N_2$ gas. These vapors diffuse into the melt 12 of GaP solution contained by the boat 14 in the furnace 4 the interior of which is heated up to 1100° C (FIG. 3A). Thus, the source of the liquid phase epitaxial growth is formed. 35mg to 40mg of Zn is contained in the Zn-furnace 2, 0.2g of $Ga_2O_3$ in the $O_2$-furnace 3 and 21.4g of the melt of Ga-GaP solution (Ga: 20g, GaP: 1.4g) in the liquid phase epitaxial growth furnace 4.

Next, the apparatus is tilted clockwise by a predetermined angle $\theta$, for example, 5° to 6°. The melt 12 of Ga-GaP solution into which Zn and $Ga_2O$ diffuse, flows rightward along the bottom of the boat 14 into the space 21 between the wafers 23a and 23b, so as to perfectly fill the space 21. The liquid phase epitaxial growth starts.

After the surface layers of the wafers 23a and 23b are saturated with Zn and O, the apparatus is again horizontally set. The specific gravity of GaP contained in the melt 12 of Ga-GaP solution is 4.13 at room temperature, a specific gravity which is almost unchanged at 1100° C. The specific gravity of Ga contained in the melt 12 of Ga-GaP solution is 5.94 at the room temperature a specific gravity, which is almost unchanged at 1100° C. Thus, the difference between the specific gravities of GaP and Ga is relatively large. Accordingly, the concentration of Gap is higher in the upper side of the melt 12 than in the lower side of the melt 12, since the specific gravity of GaP is smaller than that of Ga. Namely, the concentration of GaP near the lower surface of the wafer 23b is higher than that of GaP near the upper surface of the wafer 23a.

The interior of the furnace 4 is gradually cooled to 900° C from 1100° C. GaP containing Zn and O deposits at different rates on the upper surface of the wafer 23a and on the lower surface of the wafer 23b. The deposition rate at the wafer 23b-side with the higher concentration of GaP is higher than the deposition rate at the wafer 23a-side with the lower concentration of GaP. As the result, a P-type semiconductive region about $50\mu$ thick is formed on the wafer 23a, while a P-type semiconductive region about $100\mu$ thick is formed on the wafer 23b. Thus, PN-junctions are formed on the wafers 23a and 23b, respectively. The epitaxially grown wafer 23a can be used as a lamp, and the epitaxially grown wafer 23b can be used for a numeral display. After the operation starts, the interior of the furnace 4 is gradually heated up to the temperature 1100° C for the liquid phase epitaxial growth, from the initial temperature 900° C. About 10 minutes are required for heating up the furnace 4. The total operating time in which the time required for cooling furnace 4 is included, is about 20 minutes.

As above mentioned, two epitaxial layers differing from each other in thickness are concurrently formed on the two wafers 23a and 23b respectively in one operation by use of the spacer 20. The two wafers 23a and 23b can be used for different purposes. It is not required to change the conditions of the liquid phase epitaxial growth and the composition of the melt 12 of Ga-GaP solution in order to obtain epitaxial layers which are different from each other in thickness. Accordingly, the operation is very simple and mass production is possible. It is required in the conventional method to heat the interior of the liquid phase epitaxial growth furnace up to 1170° C in order to form the liquid phase epitaxial layer for the numeral display. Moreover, about 40 minutes are required for the whole operation. On the other hand, the maximum heating temperature can be lowered by about 70° C in this embodiment in comparison with the conventional method. Accordingly, impurities can hardly diffuse into the melt of Ga-GaP solution from the quartz tube 5, and so the purity of the epitaxial layer can be greatly improved. Moreover, the operating time can be shortened to half of the operating time required for the conventional method.

Figure 5:
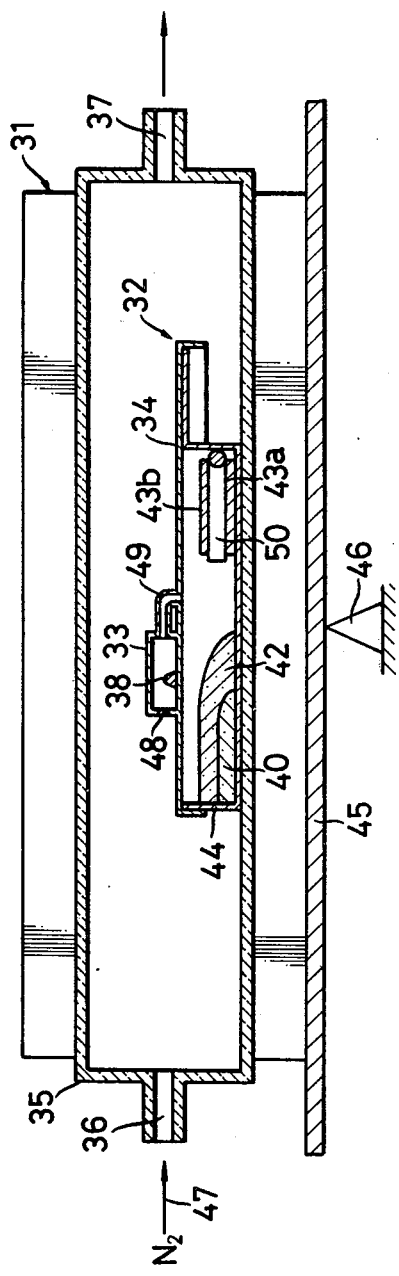
FIG. 5 is a cross-sectional view of a liquid phase epitaxial growth apparatus according to another embodiment of this invention.

Next, another embodiment of this invention will be described with reference to FIG. 5 to FIG. 7.

First, a construction of a liquid phase epitaxial growth apparatus 31 according to this embodiment will be described with reference to FIG. 5. The apparatus 31 has a quartz tube 35 around which a heating means (not shown) is arranged. An $N_2$-gas inlet 36 is formed at the left end of the quartz tube 35, and a gas discharging outlet 37 is formed at the right end of the quartz tube 35. The quartz tube 35 can be tilted clockwise or anticlockwise around a fulcrum 46 arranged under the central portion of a base plate 45, together with the base plate 45. A reaction container 32 is disposed in the quartz tube 35. The liquid phase epitaxial growth is effected in the reaction container 32. The reaction container 32 comprises a boat 44 made of glassy carbon, containing $Ga_2O_3$ 40, a melt 42 of Ga-GaP solution covering $Ga_2O_3$ 40 and two semiconductor wafers 43a and 43b, a cap member 34 made of quartz fitted to the boat 44 and having a Zn-chamber 33 is arranged thereon to contain Zn 38 as P-type impurities. In the boat 44, the wafers 43a and 43b are spaced about 2mm apart and parallel with each other by a spacer 50, as shown by the wafers 23a and 23b of FIG. 4.

Figure 6:
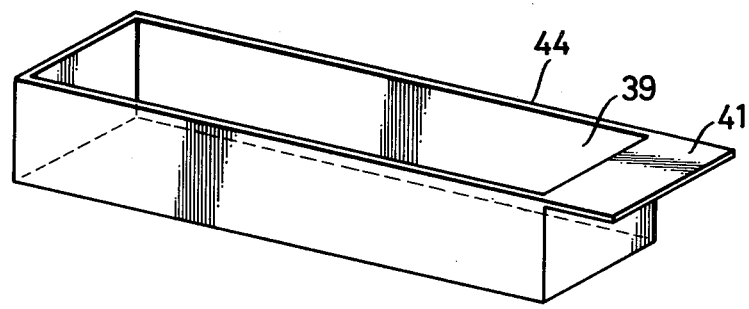
FIG. 6 is an enlarged perspective view of a boat contained in the apparatus of FIG. 5.
Figure 7:
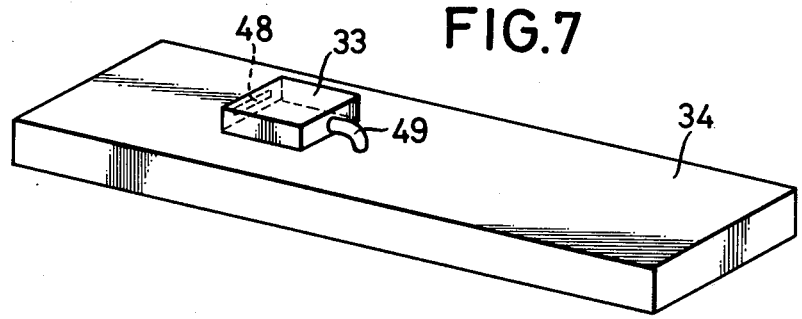
FIG. 7 is an enlarged perspective view of a cap member fitted to the boat of FIG. 6.

The boat 44 is of the shape of rectangular parallelepiped (FIG. 6). An opening 39 is formed in the boat 44. A projection 41 is formed at one upper end of the boat 44. The width of the boat 44 and the length thereof are slightly smaller than those of the cap member 34. When the cap member 34 is fitted to the boat 44, the opening 39 is completely closed by the cap member 34 and the cap member 34 is firmly held by the boat 44. The Zn-chamber 33 formed in the cap member 34 is shaped as a rectangular parallelpiped (FIG. 7). A slit 48 for feeding $N_2$ gas is formed in one wall of the Zn-chamber 33. A curved pipe 49 for feeding the vapor of Zn is disposed at another wall of the Zn-chamber 33. The curved pipe 49 communicates with the Zn-chamber 33 and the interior of the boat 44. The diameter of the curved pipe 49 is chosen to feed the vapor of Zn into the boat 44 at a predetermined rate, for example at 1mg/min. The vapor of Zn is fed into the boat 44 from the Zn-chamber 33 through the curved pipe 49.

Next, operation of the apparatus 31 will be described with reference to FIG. 5.

An $N_2$ gas 47 as a carrier gas is fed into the quartz tube 35 through the inlet 36 when the apparatus 31 is horizontally set. The quartz tube 35 is heated up to 950° C. 35mg to 40mg of Zn 38, 0.2g of $Ga_2O_3$ 40, and 21.4g of the melt 42 of Ga-GaP solution (20g of Ga and 1.4g of GaP) are used in this embodiment. Since the heating temperature is far higher than the melting point of Zn 38, Zn 38 is evaporated. The vapor of Zn 38 is fed into the boat 44 through the curved pipe 49 at a predetermined rate, so that it contacts with the diffuse 42 of Ga-GaP solution to melt thereinto. $Ga_2O_3$ 40 reacts on the Ga contained within the melt 42 of Ga-GaP solution to form $Ga_2O$. Thus, Zn and $Ga_2O$ material for into the melt 42 of Ga-Gap solution to form the source material for the liquid phase epitaxial growth.

Next, the apparatus 31 is tilted clockwise around the fulcrum 46 by 5° to 6°. The melt 42 of Ga-GaP solution containing Zn and $Ga_2O$ flows to the right along the bottom of the boat 44 into the space between the wafers 43a and 43B, so that the upper surface of the wafer 43a and the lower surface of the wafer 43b are covered by the melt 42 of Ga-GaP solution. The surface layers of the wafers 43a and 43b are eroded by the melt 42 comprising a Ga-GaP solution. Accordingly, with the temperature of the quartz tube 35 at 1100° C GaP the wafers 43a and 43b are saturated with Zn and $Ga_2O$. In operation, the quartz 35 is gradually heated up to the temperature 1100° C for the liquid phase epitaxial growth from the initial temperature of 950° C. The operating time is about 10 minutes.

Next, the apparatus 31 is tilted counterclockwise around the fulcrum 46 by 5° to 6°, so that it is again horizontally set. Accordingly, the thickness of the GaP layer of locally uniform concentration in the melt 42 is equalized on the wafers 43a and 43b. Since the specific gravity of GaP is smaller than that of Ga, the concentration of GaP is higher in the upper side of the melt 42 of Ga-GaP solution than in the lower side thereof. The quartz tube 35 is cooled to 950° C from 1100° C in about ten minutes. As a result, GaP containing Zn and O is deposited on the wafer 43a to form a P-type semiconductive region about 50μ thick, while GaP containing Zn and O is deposited on the wafer 43b to form a P-type semiconductive region about 100μ thick. Since PN-junctions are formed on the wafers 43a and 43b and the P-type semiconductive regions contain O, red light emitting diodes are formed on the wafers 43a and 43b, respectively. The red light emitting diode formed on the wafer 43a can be used for a lamp. The red light emitting diode formed on the wafer 43b can be used as a figure display.

In this embodiment, the epitaxial layers differing from each other in thickness can be concurrently formed on the wafers in one operation. The operation can be simplified. Mass production is possible. The operating time can be shortened. Moreover, the purity of the epitaxial layer can be improved.

In this embodiment, since the reaction container 32 has a boat 44 in which the liquid phase epitaxial growth is effected, and has a cap member 34 provided with the Zn-chamber 33 communicating with the interior of the boat 44, the desired liquid phase epitaxial growth can be effected by heating only one reaction container 32. The Zn-furnace, the $O_2$-furnace and the liquid phase epitaxial growth furnace are not separately arranged in this embodiment. Accordingly, the temperature control and the temperature programming can be simplified. The liquid phase epitaxial growth can be satisfactorily effected in a short time. It is easy to handle the apparatus 31. According to this embodiment, the liquid phase epitaxial growth apparatus can be reduced in size. Since the cap member 34 is used, contamination of the quartz tube 35 by Zn 38, $Ga_2O_3$ 40 and the melt 42 of Ga-GaP solution is minimized. The feeding rate of the vapor of Zn can be adjusted by choosing an appropriate diameter for the curved pipe 49. Accordingly, desirable epitaxial growth characteristic can be effected.

Moreover, in this embodiment, it is not always required to form the slit 48. Without the slit 48, the vapor of Zn 38 can be fed into the boat 44. Any inert gas or air can be substituted for the $N_2$ gas. A container containing $Ga_2O_3$ 40, the melt 42 of Ga-Gap solution and the wafers 43a and 43b may be connected to another container containing Zn by a pipe for feeding the Zn vapor. In such a case, the containers and the pipe can be vertically arranged, and the wafers may be dipped into the melt of Ga-GaP solution.

In the above-mentioned embodiment, after Zn is diffused into the melt 42, the melt 42 contacts with the surfaces of the wafers 43a and 43b. However, after the melt 42 doped with N-type impurities, for example, Te, contacts with the surfaces of the wafers 43a and 43b, the vapor of Zn may be diffused into the melt 42 during the course of the epitaxial growth and cooling of the melt 42, so as to a form PN-junction in the resulting epitaxial layer respectively formed on the wafers 43a and 43b.

While the invention has been particularly shown and described with reference to preferred embodiments thereof, it will be understood by those skilled in the art that the foregoing and other changes in form and details may be made therein without departing from the spirit and scope of the invention.

Figure 8:
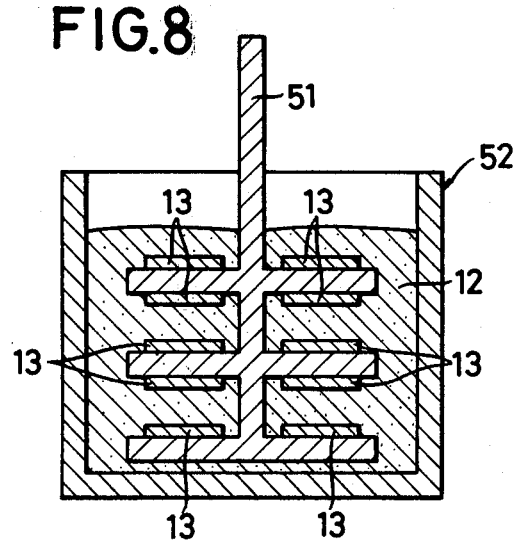
FIG. 8 is a cross-sectional view of a liquid phase epitaxial growth apparatus according to a further embodiment of this invention.

For example, a modification as shown in FIG. 8 is possible. A holder 51 having three fins is prepared. Numerous wafers 13 are fixed on the upper and lower surfaces of the fins. A vessel 52 contains the melt 12 of Ga-GaP solution into which Zn and O diffuse. The holder 51 holding the wafers 13 is dipped into the melt 12 and the liquid phase epitaxial growth is effected. As a result, epitaxial layers with different thicknesses are concurrently formed on the wafers 13 in one operation.

$NH_3$ and/or $H_2S$ for green light emitting may be substituted for $Ga_2O$ for red light emitting, in order to diffuse N and/or S into the melt. Cd may be substituted for Zn as an impurity. Thus, various light emitting diodes can be manufactured, depending on the materials used for light emitting and impurities. Moreover, this invention is not limited to the light emitting diode, but it may be applied to various semiconductor devices doped with impurities. The wafer may be made of Ga, As or any other material.

What is claimed is:
1. A method of making a liquid phase epitaxial layer of gallium phosphide comprising the steps of providing at least two horizontal semiconductor wafers of one conductivity, one of said wafers being substantially parallel to and above the other wafer at a predetermined distance, providing a melt of gallium-gallium phosphide solution, causing said melt to freely flow at least between said semiconductor wafers to fill an area therebetween, and simultaneously growing by cooling said melt on an epitaxial layer of greater thickness on an upper one of said two wafers and lesser thickness on a lower one of said two wafers.

2. A method according to claim 1, wherein said wafers are made of gallium phosphide.

3. A method according to claim 1, wherein said melt contains impurities giving the conductivity type opposite to that of said wafers.

4. A method according to claim 3 including the step of diffusing impurities of opposite conductivity type into said melt.

5. A method according to claim 1, wherein said melt contains impurities giving the same conductivity type as that of said wafers.

6. A method according to claim 1, wherein the distance between said wafers is 1.5mm to 6mm.

7. A method of simultaneously making at least two liquid phase epitaxial layers of a gallium compound with substantially differing thickness, comprising the steps of:
  a. providing horizontal upper and lower semiconductor wafers spaced apart by a spacing means, said wafers and spacing means being provided in a tiltable container means;
  b. providing a melt of gallium with a gallium compound and an impurity of given conductivity type diffused therein, a concentration of said gallium compound being higher at an upper surface of said melt and lower at a lower surface of said melt, said melt being positioned adjacent said wafers in said container means;
  c. tilting said container means to freely flow said melt between said wafers; and
  d. simultaneously growing by coating an epitaxial layer of greater thickness on said upper layer and an epitaxial layer of lesser thickness on said lower layer due to the concentration difference of said gallium compound.

8. The method of claim 7 in which said wafers comprise gallium phosphide and said gallium compound comprises gallium phosphide.

9. The method of claim 7 comprising the additional step of diffusing the impurity of given type into said melt from a chamber on top of said container means.

10. The method of claim 7 in which said spacing means comprise a member intermediate said two wafers.

11. The method of claim 7 in which the wafers are spaced apart between 1.5 mm to 6 mm.

12. A method of simultaneously making at least two liquid phase epitaxial layers of a gallium compound with substantially differing thickness, comprising the steps of:
  a. providing horizontal upper and lower semiconductor wafers spaced apart and retained by a holding means;
  b. providing a melt of gallium with a gallium compound and an impurity of given conductivity type diffused therein, said melt being contained in a vessel;
  c. dipping said holding means into said vessel to freely flow said melt between said wafers; and
  d. simultaneously growing by cooling an epitaxial layer of greater thickness on said upper layer and an epitaxial layer of lesser thickness on said lower layer.

* * * * *